United States Patent
Sosnowski

[11] Patent Number: 6,136,131
[45] Date of Patent: Oct. 24, 2000

[54] METHOD OF SHIELDING AND OBTAINING ACCESS TO A COMPONENT ON A PRINTED CIRCUIT BOARD

[75] Inventor: Anthony Michael Sosnowski, Stroudsburg, Pa.

[73] Assignee: Instrument Specialties Company, Inc., Delaware Water Gap, Pa.

[21] Appl. No.: 09/089,238

[22] Filed: Jun. 2, 1998

[51] Int. Cl.⁷ ............................. B32B 31/00; H05K 9/00
[52] U.S. Cl. .................... 156/256; 156/252; 156/268; 156/257; 174/35 R; 257/660; 225/93; 83/33; 428/43; 428/901
[58] Field of Search ................... 174/35 R, 67, 174/52.1; 257/660; 156/252, 256, 268, 257; 225/93; 83/33; 428/901, 43

[56] References Cited

U.S. PATENT DOCUMENTS

| | | | |
|---|---|---|---|
| 3,809,233 | 5/1974 | Gruszka | 206/328 |
| 4,754,101 | 6/1988 | Stickney et al. | 174/35 R |
| 5,354,951 | 10/1994 | Lange, Sr. et al. | 174/35 R |
| 5,508,889 | 4/1996 | Li | 361/816 |
| 5,586,011 | 12/1996 | Alexander | 361/818 |
| 5,614,694 | 3/1997 | Gorenz, Jr. et al. | 174/35 R |
| 5,635,775 | 6/1997 | Colburn et al. | 307/91 |
| 5,644,101 | 7/1997 | Elliott | 174/35 R |
| 5,886,879 | 5/1999 | Matuschik | 361/818 |
| 5,917,708 | 6/1999 | Moran et al. | 361/800 |

FOREIGN PATENT DOCUMENTS

| | | |
|---|---|---|
| 0 407 072 A1 | 1/1991 | European Pat. Off. . |
| 0 539 132 | 4/1993 | European Pat. Off. . |
| 195 09 553 | 7/1996 | Germany . |
| 197 32 618 | 2/1998 | Germany . |
| WO 91/14354 | 9/1991 | WIPO . |
| WO 96/06520 | 2/1996 | WIPO . |

OTHER PUBLICATIONS

Leader Tech Brochure, "Style CBS Circuit Board Component Shielding," Mar. 1992, pp. 1–11.

Instrument Specialties Catalog, "Engineering Design and Shielding Product Selection Guide," pp. 76 & 77, Apr. 1998.

Zuber, W., "Automated Manufacturing RF–Shielding and Sealing," Motorola Technical Developments, Motorola, Inc., May 1996, pp. 190–191.

*Primary Examiner*—Curtis Mayes
*Assistant Examiner*—Linda L. Gray
*Attorney, Agent, or Firm*—Burns Doane Swecker & Mathis L.L.P.

[57] ABSTRACT

A method for shielding and obtaining access to a component on a printed circuit board including providing a printed circuit board having a component encompassed by a shielding enclosure including a plurality of side walls and an integral top surface having a scored line which defines an interior portion, severing the scored line, removing the interior portion leaving the shielding enclosure with a remaining perimeter rim and allowing access to the component, providing a replacement cover for the shielding enclosure, and attaching the replacement cover to the shielding enclosure to replace the interior portion and to thereby encompass and shield the component. The replacement cover may be attached by soldering or by an adhesive surface of the replacement cover.

6 Claims, 2 Drawing Sheets

METHOD OF SHIELDING AND OBTAINING ACCESS TO A COMPONENT ON A PRINTED CIRCUIT BOARD

BACKGROUND OF THE INVENTION

1. Field of the Invention

The present invention relates generally to a shielding system for a printed circuit board, and in particular, to a shielding system having an integral shielding enclosure with a fixed cover that may be permanently removed, and a replacement cover for attaching thereto.

2. Description of the Related Art

As is well known in the prior art, selected electric or electronic parts on a printed circuit board radiate electromagnetic waves which thereby cause noise or unwanted signals to appear in adjacent components on the printed circuit board or electric or electronic parts and devices existing in the vicinity of the printed circuit board. Accordingly, it is highly desirable to provide shielding for electronic components of printed circuit boards such as those found in radio transmitters, radio receivers, computers and other electronic devices that use circuitry that emits or is susceptible to electromagnetic radiation. It is known that these components can be shielded to reduce undesirable electromagnetic interference and/or susceptibility effects with the use of a conductive shield that reflects or dissipates the electromagnetic charges and fields. Such shielding may be grounded to allow the offending electrical charges and fields to be dissipated without disrupting the operation of the electronic components enclosed within the shield.

A variety of devices have been utilized for shielding electronic components, but these prior art devices have not been entirely satisfactory since they do not allow for easy access to the underlying electronic component after the installation of the shield.

For example, a conventional metal shield cover, or can, is mounted to a printed circuit board by using fasteners appropriate for the purpose. Thereafter, the metal shield is soldered or welded to selected grounding strips on the printed circuit board at selected locations of its side walls. Using solder or welding to mechanically hold and electrically connect the metal shield to the printed circuit board permanently affixes the metal shield over the selected electronic component(s).

After assembling the completed printed circuit board, including the required metal shields, the printed circuit board will generally be subjected to a "burn-in" stage during which it is subjected to elevated temperature tests. If one of the electronic components should fail during the burn-in, however, that component must be replaced. Thus, it becomes necessary to desolder or unweld the metal shield from the printed circuit board in order to obtain access to the failed component and replace the same. This is very difficult to successfully accomplish and, more than likely, the entire printed circuit board will be destroyed.

In order to overcome this problem, shielding devices, such as that disclosed in U.S. Pat. No. 4,754,101 of the present assignee, the entire contents of which are hereby incorporated by reference, have included a separate wall enclosure and a removable cover. The cover is resiliently held in place by deflectable engagement prongs extending from an upper edge of the wall enclosure. The presence of the resiliently held cover allows access to the underlying electronic component, should the same be required, however, the manufacturing costs associated with the formation of the engagement prongs are also increased.

Accordingly, there exists a need for a shielding cover which can be soldered to the printer circuit board, but which still allows access to the underlying electronic component should it be necessary to replace, repair or otherwise adjust the same, and which can be inexpensively manufactured.

SUMMARY OF THE INVENTION

The present invention overcomes these disadvantages by providing an electromagnetic shielding system including a shielding enclosure having a plurality of side walls and an integral top surface. The top surface includes a scored line for allowing removal of an interior portion of the top surface to thereby define a remaining perimeter rim. A replacement cover is also included for attachment to the remaining cover rim after the interior portion is removed. The replacement cover may include a metal foil having an adhesive surface or a metal sheet material.

The present invention further provides a method for shielding and obtaining access to a component on a printed circuit board. The method includes providing a printed circuit board having a component encompassed by a shielding enclosure. The shielding enclosure includes a plurality of side walls and an integral top surface having a scored line which defines an interior portion. The scored line on the top surface of the shielding enclosure is severed and the interior portion of the top surface defined by the scored line is removed to thereby leave a remaining perimeter rim on the printed circuit board and allow access to the component within the rim. The scored line may be severed by grasping a hole in the top surface of the shielding enclosure and applying force. A replacement cover is also provided for the top surface of the shielding enclosure. The replacement cover is attached to the shielding enclosure to thereby encompass and shield the component.

BRIEF DESCRIPTION OF THE DRAWINGS

These, and other, objects, features and advantages of the present invention will become more readily apparent to those skilled in the art upon reading the following detailed description, in conjunction with the appended drawings, in which.

DETAILED DESCRIPTION OF THE PREFERRED EMBODIMENTS

Figure 1:
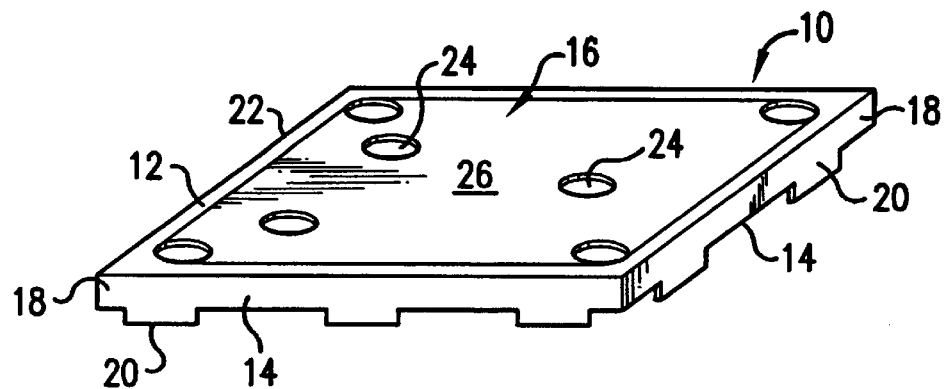
FIG. 1 is a perspective view of a printed circuit board shielding enclosure in accordance with the present invention.

Referring to FIG. 1, an electromagnetic shielding system for a printed circuit board in accordance with the present invention is shown generally by reference numeral 10. Shielding system 10 is designed to be welded, soldered, or otherwise fixed to a printed circuit board (not shown) during the manufacture thereof and thereby encompass and shield one or more underlying electronic components that are mounted on the printed circuit board. The electromagnetic shielding system 10 can be used to shield either a section or component of a printed circuit board or the entire board.

Shielding system 10 includes an enclosure 12 defined by side walls 14 and a top surface 16 integrally joined therewith. If desired, the walls 14 could be formed into any reasonable configuration. However, in the preferred embodiment, the walls 14 are formed into a square, rectangle or other quadrilateral shape. By using the walls 14 in the form of a rectangle, the configuration of the top surface 16 is simplified along with a simplification of mounting the walls 14 on a conventional printed circuit board. The walls 14 and the top surface 16 are preferably made from a metallic material, such as tin plated steel. However, other materials including other metals such as tin plated phosphor bronze, beryllium copper and other alloys of copper may of course also be used depending upon the required shielding. In particular, however, it is desirable that the material be metals that are capable of being readily soldered or welded and capable of low resistance electrical conductivity. However, if the primary purpose of the shield is to reduce magnetic field interference, it is generally preferable to use a steel or other alloy which has a relatively high permeability at low frequencies. To provide electrical conductivity on materials with relatively high resistance, the material may be plated with a low resistance metal, such as tin. If the principal concern is to reduce electrical field interference, then it is generally preferable to use a copper alloy as will be readily apparent to one skilled in the art of electromagnetic shielding. The walls 14 and the top surface 16 preferably have a thickness of approximately 0.005 in. when the metal material is tin plated steel, tin plated phosphor bronze, or stainless steel. Other thicknesses could of course also be used depending upon the material used to form the walls 14 and the top surface 16 and the end use environment in which the enclosure 12 will be placed.

Each of the walls 14 includes a side member portion 18 and, preferably, one or more projections 20 extending from a lower edge of the side member portion 18. The projections 20 are preferably soldered to the printed circuit board to obtain a surface mount thereon, although through hole mounting or any other type of known mounting arrangement could also be utilized. In this regard, the enclosures 12 of the present invention are adaptable for tape and reel packaging for use in standard automated pick and place equipment or, alternatively, the enclosures of the present invention may be packed in trays for correct orientation within an automated system or, still further, they be may packed in bulk as may be required by conventional equipment.

Figure 4:
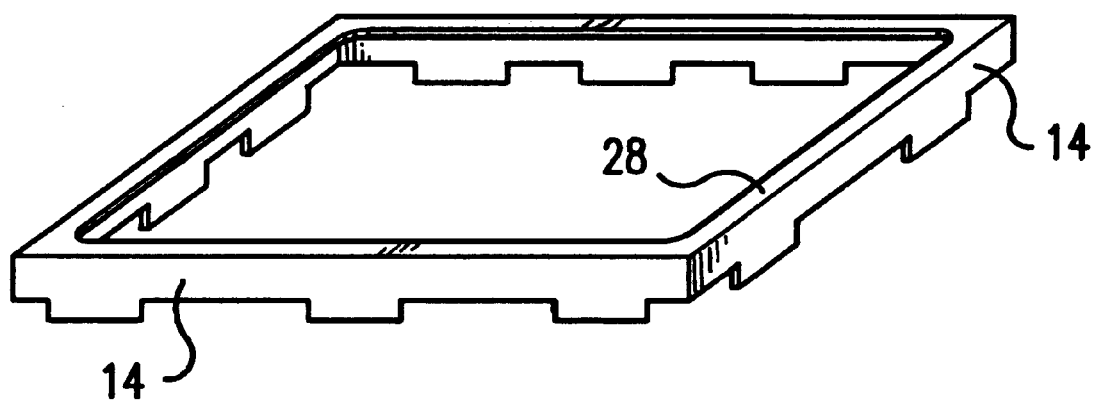
FIG. 4 is a perspective view of the shielding enclosure of FIG. 1 with the cover having been removed.

As shown in FIG. 1, the top surface 16 includes a scored line 22 extending parallel to the perimeter thereof. Although illustrated as being scored substantially continuously around the perimeter, it is also within the scope of the present invention that the scored line 22 may not be continuous and that it may include portions therealong that are not scored, such as along one or more sides of the top surface for example. A non-continuous scored line 22 may be used in order to increase the rigidity of the top surface 16 and its ability to withstand vibrations and shocks encountered during use. The scored line 22 is preferably spaced approximately 0.020 in. from the outer perimeter edge in the illustrated embodiment, however, it will be apparent to one skilled in the art that other placements could of course also be used depending upon the specific configuration and size of the enclosure and the top surface thereof. The scored line 22 allows an interior portion 26 of the top surface 16 to be removed, and thereby define a remaining perimeter rim 28, as shown in FIG. 4. Being able to remove an integral portion of the top surface, i.e., the interior portion 26, allows access to be gained to an underlying electronic component without removing the entire enclosure 12, as discussed in further detail below.

If desired for ventilation, the top surface 16 may include air vents 24 in the form of small circular holes as shown in FIG. 1. The vents 24 illustrated in the corners of the top surface assist, in conjunction with the score line 22, in allowing for the break away of the interior portion. The vents or holes 24 disposed in the interior portion 26 can additionally serve as thumb nail grips for starting the removal of the same. The top surface 16 may include, instead of or in addition to the vents 24, louvers or perforations for ventilation, heat sink components, handles, or other hardware to suit a specific need or function. In addition, material to absorb electrical energy, such as a microwave absorber, may be attached or bonded to the inside of the top surface 16.

Figure 2:
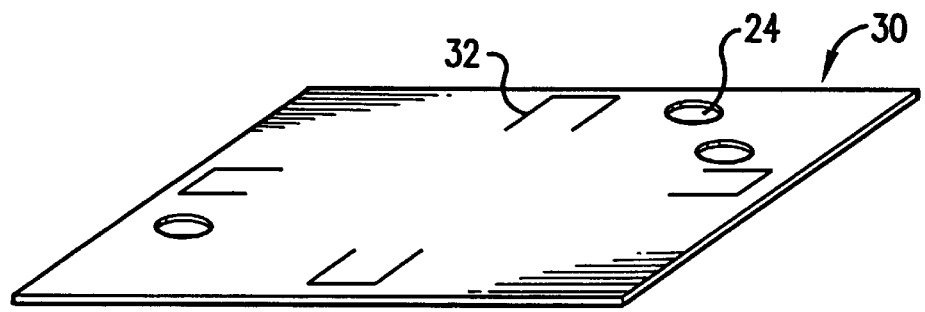
FIG. 2 is a replacement cover for the enclosure shown in FIG. 1, in accordance with a first embodiment of the present invention.

If it is necessary to access an electronic component shielded by the enclosure 12, and the interior portion 26 of the top surface 16 is removed, it is also then necessary to provide a cover which will replace the removed interior portion 26 after the repair or replacement of the electronic component is performed. Referring to FIG. 2, a replacement cover 30 is shown in accordance with the present invention. The replacement cover 30 is preferably made from the same metal material as the enclosure 12, although a different metal material could of course also be used. The replacement cover 30 also includes vents 24 and a plurality of etched formed or lanced elements 32 which are provided in order to assist in self locating the cover 30 on top of the perimeter rim. Replacement cover 30 is attached to the perimeter rim 28 of the enclosure 12 by welding, soldering, or any other conventional attachment means.

Figure 3:
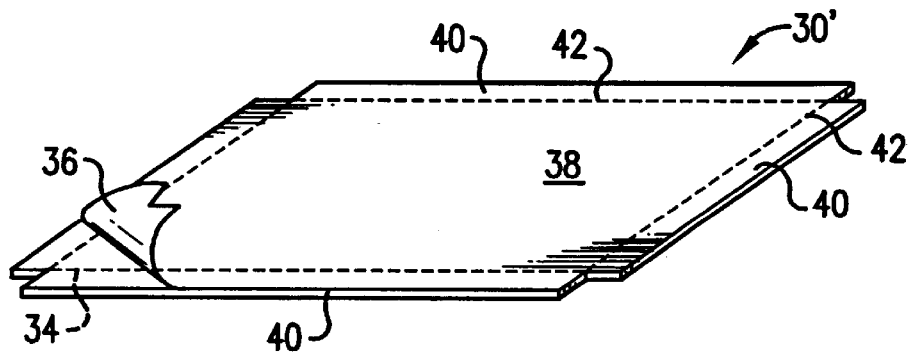
FIG. 3 is a replacement cover for the enclosure shown in FIG. 1, in accordance with a second embodiment of the present invention.
Figure 5:
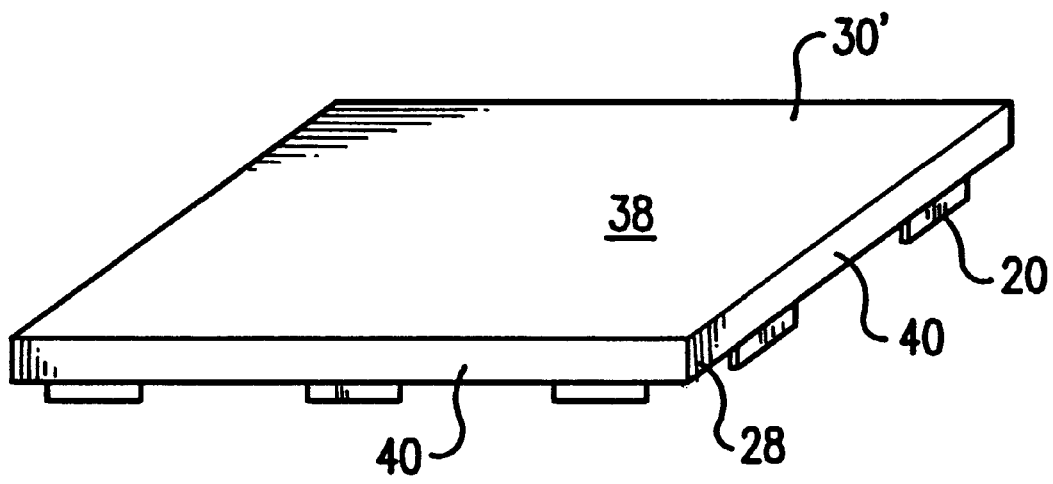
FIG. 5 is a perspective view of the shielding enclosure of FIG. 4 with the replacement cover of FIG. 3 attached thereto.

Alternatively, a further embodiment of the replacement cover is shown in FIG. 3 by reference numeral 30'. Replacement cover 30' includes a main portion 38 generally corresponding in shape to the configuration of the perimeter rim 28. Preferably, cover 30' also includes a plurality of side flanges 40 extending therefrom and a plurality of predefined bend lines 42 disposed between the main portion 38 and the flanges 40. Replacement cover 30' is made from a metal foil and includes an adhesive surface 34 that is, at least initially, provided with a release paper 36. Replacement cover 30' is attached to the perimeter rim 28 of the enclosure, and also preferably the side walls 14, by removing the release paper 36 to expose the adhesive surface 34, and by bringing the adhesive surface 34 into contact with the rim 28 and folding down the side flanges 40 along the bend lines 42 to thereby bring the flanges 40 into contact with the side walls 14, as shown in FIG. 5.

The operation of the shielding system 10 of the present invention can be described as follows. During the initial manufacture of a printed circuit board, shielding enclosure 12 is disposed over one or more electric or electronic components or the entire board, in order to reduce the electromagnetic interference with adjacent components. At some point in time after burn-in, or later, it may become necessary to replace, repair or otherwise adjust one of the components being shielded by the enclosure 12. In such instance, the score line 22 allows the interior portion 26 of the enclosure 12 to be removed using the vents 24 as grips or otherwise exerting a slight force to sever the score line 22 and completely separate the interior portion 26. As shown in FIG. 4, the perimeter rim 28 of the enclosure 12 will remain attached to the printed circuit board (not shown). Thus, the shielding system 10 of the present invention allows access to the failed component such that the component itself may be replaced, rather than declaring the entire printed circuit board an entire loss.

After the failed or damaged component is removed from within the rim 28 on the printed circuit board and a new or repaired component is inserted, or after the failed or damaged component is repaired or otherwise adjusted while still on the printed circuit board, the replacement cover 30, 30' is then attached to the perimeter rim 28 in order to again form a complete shielding enclosure over the electronic component. As shown in FIG. 5, the replacement cover 30' is attached to the perimeter 28 by applying the adhesive surface 34 directly thereto. Similarly, replacement cover 30 is welded, soldered, or otherwise mechanically attached to the perimeter 28. In each instance, the replacement cover 30, 30' together with the perimeter rim 28 encompass and shield the one or more underlying electronic components that are mounted on the printed circuit board.

The shielding system 10 of the present invention may be easily and inexpensively manufactured, in comparison with the resiliently held covers of the prior art. During manufacture, the enclosure 12 including the cover 16 is stamped or punched from a sheet material. The score line 22 and air vents 24 are also cut into the sheet material at this stage. Afterwards, the sides of the enclosure are bent to form the side member portions 18 and thereby obtain the final product. The covers 30, 30' are likewise easily formed using standard sheet metal or sheet foil processing techniques.

While the present invention has been described with preferred embodiments, it is to be understood that variations and modifications may be resorted to as will be apparent to those skilled in the art. Such variations and modifications are to be considered within the purview and the scope of the claims appended hereto.

What is claimed is:

1. A method for shielding and obtaining access to a component on a printed circuit board, said method comprising:

providing a printed circuit board having a component encompassed by a shielding enclosure including a plurality of side walls and an integral top surface having a scored line which defines an interior portion;

severing the scored line on the top surface of the shielding enclosure;

removing the interior portion of the top surface defined by the scored line, thereby leaving the shielding enclosure with a remaining perimeter rim and allowing access to the component within the shielding enclosure;

providing a replacement cover for the shielding enclosure;

attaching the replacement cover to the shielding enclosure to replace the interior portion and to thereby encompass and shield the component.

2. The method of claim 1, wherein said severing step further includes grasping a hole in the top surface of the shielding enclosure and applying force to thereby sever the scored line.

3. The method of claim 1, wherein said attaching step includes soldering the replacement cover to the perimeter rim of the shielding enclosure.

4. The method of claim 1, wherein said attaching step includes pressing an adhesive surface of the replacement cover onto the perimeter rim of the shielding enclosure.

5. The method of claim 4, wherein the replacement cover includes a plurality of side flanges and said attaching step further includes pressing the adhesive surface of the side flanges of the replacement cover onto the side walls of the shielding enclosure.

6. The method of claim 4, wherein the replacement cover includes a plurality of side flanges and a predefined bend line associated with each of the side flanges, said attaching step further including bending the side flanges along the predefined bend lines and pressing the adhesive surface of the side flanges of the replacement cover onto the side walls of the shielding enclosure.

* * * * *